(12) United States Patent
Wimmer

(10) Patent No.: US 10,727,617 B2
(45) Date of Patent: Jul. 28, 2020

(54) SHIELDED ELECTRIC CABLE ARRANGEMENT AND SHIELD HOUSING

(71) Applicant: Lisa Draexlmaier GmbH, Vilsbiburg (DE)

(72) Inventor: Wolfgang Wimmer, Salching (DE)

(73) Assignee: LISA DRAEXLMAIER Gmbh, Vilsbiburg (DE)

( * ) Notice: Subject to any disclaimer, the term of this patent is extended or adjusted under 35 U.S.C. 154(b) by 0 days.

(21) Appl. No.: 16/347,769

(22) PCT Filed: Nov. 6, 2017

(86) PCT No.: PCT/EP2017/078312
§ 371 (c)(1),
(2) Date: May 6, 2019

(87) PCT Pub. No.: WO2018/083295
PCT Pub. Date: May 11, 2018

(65) Prior Publication Data
US 2019/0288416 A1 Sep. 19, 2019

(30) Foreign Application Priority Data
Nov. 7, 2016 (DE) .......................... 10 2016 121 168

(51) Int. Cl.
*H01R 11/26* (2006.01)
*H05K 9/00* (2006.01)
(Continued)

(52) U.S. Cl.
CPC .............. *H01R 11/26* (2013.01); *B60R 16/02* (2013.01); *H01R 4/44* (2013.01); *H01R 4/58* (2013.01);
(Continued)

(58) Field of Classification Search
CPC .............................. H01R 11/26; H05K 9/0098
See application file for complete search history.

(56) References Cited

U.S. PATENT DOCUMENTS

| 4,615,578 A | 10/1986 | Stadler et al. |
| 6,388,191 B1 | 5/2002 | Maegawa |
| 2010/0190360 A1* | 7/2010 | Werner ................ H01H 85/205 439/76.2 |

FOREIGN PATENT DOCUMENTS

| DE | 44 05 408 C1 | 5/1995 |
| DE | 10 2006 049 192 A1 | 5/2007 |

(Continued)

OTHER PUBLICATIONS

Machine Translation for JP 2001-250601, "the terminal of shielded cable" translated on Dec. 8, 2019, 7 pages (Year: 2001).*

(Continued)

*Primary Examiner* — Hung V Ngo
(74) *Attorney, Agent, or Firm* — Jacob Eisenberg

(57) ABSTRACT

An electrical cable arrangement comprises a dimensionally stable flat conductor bar with a flat conductor shield; at least one electric cable connected thereto and having a cable shield; and a shield housing made of an aluminum material and having a first housing part and a second housing part. Between the housing parts a closed accommodating chamber is formed for a connecting section between the flat conductor bar and the cable. When in the installed state, the flat conductor bar and the cable are each clamped tight between the housing parts by an end face section in such a manner that the flat conductor shield and the cable shield are directly or indirectly interconnected for the shield transition.

14 Claims, 3 Drawing Sheets

(51) Int. Cl.

| | |
|---|---|
| *H01R 4/44* | (2006.01) |
| *H01R 4/58* | (2006.01) |
| *H01R 11/28* | (2006.01) |
| *B60R 16/02* | (2006.01) |
| *H01R 13/6593* | (2011.01) |
| *H01R 4/02* | (2006.01) |

(52) U.S. Cl.
CPC ......... *H01R 11/28* (2013.01); *H01R 13/6593* (2013.01); *H05K 9/0098* (2013.01); *B60R 16/0215* (2013.01); *H01R 4/021* (2013.01); *H01R 4/029* (2013.01); *H01R 2201/26* (2013.01)

(56) References Cited

FOREIGN PATENT DOCUMENTS

| | | |
|---|---|---|
| DE | 10 2006 007 604 A1 | 8/2007 |
| DE | 20 2012 005 124 U1 | 6/2012 |
| DE | 10 2015 111 882 B4 | 1/2017 |
| EP | 2603955 B1 | 7/2011 |
| JP | 2001 250601 A | 9/2001 |

OTHER PUBLICATIONS

German Office Action dated Jun. 12, 2017 10 pages.
ISR dated Feb. 1, 2018, 20 pages.

* cited by examiner

SHIELDED ELECTRIC CABLE ARRANGEMENT AND SHIELD HOUSING

CROSS-REFERENCE TO RELATED APPLICATION

This is a National Phase Application which claims benefit to PCT Application No. PCT/EP2017/078312, filed Nov. 6, 2017, published as WO 2018/083295 A1, and which claims benefit of German Application No. 10 2016 121 168.0, filed Nov. 7, 2016, all of which are incorporated herein by reference.

TECHNICAL FIELD

The present invention relates to a shielded electric cable arrangement, particularly for a vehicle such as a combustion, hybrid or electric vehicle. The invention also relates to a shield housing for this type of cable arrangement.

BACKGROUND OF THE INVENTION

Shielded electric cables and shielded housings or shield housings are also used in motor vehicles to improve the electromagnetic compatibility (EMC).

For example, DE 10 2013 201 689 A1 proposes a shield housing of aluminum material, i.e. aluminum or an aluminum alloy. The shield housing has at least one opening with an inner circumference that directly or indirectly electrically contacts a shield of an electric cable. A contact sleeve made of a different material than the housing or coated with a different material is press-fitted into the opening. Although this provides good shielding for a cable arrangement with an electric cable and a shield housing, a continuous shielding between two or more cables or conductors is desirable. In addition, it has been found that press-fitting the contact sleeve into the opening is complicated from a manufacturing point of view. Therefore, there is a need to simplify the production and/or installation.

Furthermore, a cable arrangement is known from the German patent application number 102015220115.5, in which to improve the EMC a substantially rigid flat conductor bar is arranged as the ground wire in closely spaced relationship to one or more electric cables serving as supply lines. In this respect as well, there is also a need for a simple manufacturing and/or installing possibility for continuous shielding between a plurality of cables or conductors.

DESCRIPTION OF THE INVENTION

Therefore, it is the object of the present invention to create continuous shielding between two cables or conductors, particularly between a flat conductor bar and an electric cable, and to do so in as constructively simple a way as possible.

The object is achieved by the subject matters of the independent claims. Advantageous further developments of the invention are specified in the dependent claims, the description and the accompanying drawings.

The electric cable arrangement for a vehicle according to the invention comprises at least one essentially solid or inherently stable, particularly rigid flat conductor bar. Two or more flat conductor bars may also be provided which, for example, are layered or sandwiched between a ground wire and a supply line. The flat conductor bar has a flat conductor shield extending preferably over the entire length of the flat conductor bar. The cable arrangement also comprises at least one electric cable connected to the flat conductor bar, and an electric cable having a cable shield. It is also possible for several cables to be provided, i.e. at least two, such as a ground wire and a supply line. They may preferably be directly connected or, if applicable, connected through an intermediate arrangement of a contact element affixed to the flat conductor bar. In comparison to the flat conductor bar the electric cable may be essentially limp; however, it may also have a load conductor that is solid and hence likewise retains its shape. Furthermore, the cable may be designed with a round cross section, i.e. its cross-sectional shape may differ from that of the flat conductor bar, which has a rectangular, flat cross section.

The cable arrangement also has a shield housing made of an aluminum material, i.e. aluminum or an aluminum alloy, as for example in a shield housing produced in a die-casting process. The shield housing here consists of a first housing part such as a housing base or bottom, and a second housing part such as a housing cover. For example, the housing parts may be screwed together, and in the installed state, i.e. when they are screwed together, they form between them a closed accommodating chamber for at least one connecting section between the flat conductor bar and the cable, so that the connecting section is arranged in the self-contained, EMC-shielded accommodating chamber. When installed the flat conductor bar and/or the cable is/are each clamped tight between housing parts by an end face section, i.e. by a longitudinal end section, in such a manner that the flat conductor shield and the cable shield are directly or indirectly interconnected for the shield transition. In other words, the shield transition may also take place, for example, using the shield housing or additional elements such as a drain wire or the like. However, the two shields may also make direct contact.

Thus, by this means the invention offers a constructively simple way to establish a continuous shielding in the connection between the flat conductor bar and the electric cable or their shields. The two-part structure of the shield housing simplifies the production and/or installation as compared to the state-of-the-art press-fitting of a ferrule sleeve into an opening in a shield housing. The shield transition, namely, is largely due to clamping, meaning that no press-fitting procedure at the shield housing is necessary.

A particularly advantageous embodiment of the invention provides that at abutting edges of the housing parts, respective housing lands facing one another overlap the housing parts at least partially in the area of the accommodating chamber, in one or more directions in or transversely to a longitudinal direction of the flat conductor bar and/or the cable. This means that at the abutting edges, continuous or sectional housing lands are formed on one or both housing parts, and these lands then overlap in a direction extending along the width, thickness, or length. In this way, particularly good shielding can be achieved to improve the EMC, since by this means, due to the overlapping, the accommodating chamber is tight with regard to different frequencies, including higher ones.

The cable should not only be mechanically clamped tight, but it should also have a good electrically conductive connection to the shield housing at the point of entry of the cable. To make this possible the cable shield can be held between a support sleeve serving as an abutment and a ferrule or crimp sleeve that contacts the shield housing and is press-fitted onto the cable. The essentially concentrically superimposed support sleeve and ferrule can be deformed only with difficulty or not at all, due to their high mechanical strength, for which reason the housing parts over them can build up enough clamping force acting on the cable to permanently clamp the cable tightly in the shield housing.

The housing may have a cable feed-through in the form of a circular cable bushing, for example, to serve as the point of entry for the cable. The cable bushing may be composed of two semi-circular indentations in the installed state, one in each housing part. The ferrule here can be clamped tight between the first housing part and the second housing part in the cable bushing formed there by the indentation. The two housing parts thus enclose the outer circumference of the ferrule and apply a clamping force to it. Particularly at this point of entry the cable shield, via the ferrule, contacts the shield housing, which is electrically conductive as a result of the material used. As a result, a shield current or compensating current can flow through the shield housing. To improve the transition resistance between the ferrule and the shield housing, the aluminum housing may be completely or partially surface treated in the area of the point of entry; for example, it can be tin-plated, silver-plated, or the like.

To ensure that the cable can be especially securely clamped tight in the shield housing, which is susceptible to relaxation and creep due to the aluminum material, the housing parts may be shaped in such a manner that, prior to installation, a gap between abutting edges of the housing parts is formed in a housing section adjacent to the cable bushing. For example, this gap may be a few tenths of a millimeter, particularly from approximately 0.1 mm to 0.5 mm, preferably from 0.2 mm in size. The housing section adjacent to the cable bushing and thus adjacent to the indentation, for example, is preferably located on a face end of the shield housing. If two cable bushings are provided there for two cables in parallel arrangement relative to one another, then the housing section with the gap is preferably located between the two cable bushings. The housing parts may also overlap there, albeit in such a manner that the gap exists before the housing parts are connected, for instance by being screwed together. Due to the gap, the housing parts can be urged together with a strong clamping force which can be maintained throughout the life cycle of the shield housing. Good clamping action is achieved by the low deformability or low relaxation behavior of the ferrule.

As an alternative or in addition, a preferably resilient pressure element such as a retaining bracket, spring sheet or the like which abuts an outer circumferential area of the ferrule may press the cable or ferrule onto at least one housing part. In this way the relaxation and creep behavior of the shield housing can be even better compensated. For this purpose the pressure element can have one or two legs extending away from a base portion located in between. The leg or legs when installed may abut an outer circumferential area of the ferrule or ferrules and press them against the housing base, for example. However, the pressure element may also be designed as a spring sheet or the like. It is also conceivable that the support sleeve and/or ferrule may be slotted and resilient. Due to the spring action the two housing parts do not have to be pressed onto the ferrule with the aforementioned high clamping force, but rather a comparatively lower clamping force is sufficient. The housing part to which the ferrule is not pressed via the retaining bracket is then only necessary to close the shield housing but not to contact the ferrule. Since the electrical connection of the cable shield is established via the pressure element, to increase the conductivity the invention also may provide that the pressure element be made of a copper-plated spring sheet or that a copper strip be welded on by ultrasonic welding in the area of a threaded bolt holding the pressure element in place.

To clamp the ferrule via the pressure element, the retaining bracket, the spring sheet or the like, it is advantageous if the pressure element is held by a threaded bolt, which in the installed state is supported on the housing part via a radially circumferential collar. For example, the threaded bolt may have a collar between its longitudinal ends, which may extend beyond the shield housing in the direction of the housing thickness. The threaded bolt can then be arranged in such a manner that the collar is supported on an inner side of the shield housing, the pressure element is set up via a through-hole formed in the housing, and then the other housing part is set and screwed in place. The threaded bolt can also be press-fitted into the housing part on which it is supported; hence, it may be designed as a press-fit stud. The threaded bolt may also serve for the attachment of a terminal lug. A press nut could also be arranged instead of a threaded bolt on one of the housing parts.

For a further improved or alternative shield transition at least one (first) drain wire which contacts the cable shield may be held on the cable side, between the support sleeve and the ferrule, between which the overturned cable shield is clamped. The drain wire is then preferably clamped and held between the cable shield and the ferrule. Thus, there is a direct electrical connection between the cable shield and the drain wire, whereby if applicable a surface treatment of the shield housing to improve the electric conductivity becomes unnecessary.

In this respect it has proven to be practical for the drain wire to be guided through the interior of the shield housing and on to the flat conductor shield and to contact it when in the installed state. This is then especially advantageous if the flat conductor shield likewise has a drain wire and the drain wires can be interconnected inside the shield housing.

For example, the flat conductor shield can comprise at least one bar-side (second) drain wire that is guided along a longitudinal direction of the flat conductor bar and leads into the shield housing. This bar-side drain wire can then be connected to the cable-side drain wire inside the shield housing.

However, shielding the cable arrangement is even more effective if the flat conductor shield has an electrically conductive shield foil surrounding the flat conductor bar. This shield foil may be put over the flat conductor bar or wrapped around it, for example, and it may be made of a copper material. An insulation layer separating the two components from one another may be arranged between the flat conductor bar and the shield foil.

For the shield transition between the cable shield and the flat conductor shield the shield foil can contact the shield housing and the cable shield or ferrule via the shield housing, preferably in that the shield foil surrounds or envelopes the shield housing at least in sections. The shield foil, for example, can be clamped tightly to an outer side of the shield housing.

The flat conductor bar can have a plastic sleeve that is arranged on an end face and clamped between the housing parts, for attachment of the flat conductor bar. The plastic sleeve here extends circumferentially around the flat conductor bar and is recessed at its end faces for the connection between the flat conductor bar and the cable end.

For the connection between the flat conductor bar and the cable it has been found to be especially advantageous if a load conductor of the cable is welded, for instance, to a flat side of the flat conductor bar, particularly in an ultrasonic welding process.

The invention also relates to a shield housing for a cable arrangement in one or more variants of the embodiments explained above.

BRIEF DESCRIPTION OF THE DRAWINGS

Advantageous embodiments of the invention are explained in greater detail below with reference to the accompanying drawings. In the drawings:

The drawings are merely schematic representations and serve only to explain the invention. The same or similar elements are provided throughout with the same reference numbers.

FIG. 1 shows a perspective view of a shielded electric cable arrangement 1 for use in a motor vehicle, for instance as part of a central power supply system for the vehicle. As an example, the cable arrangement 1 here has a shielded flat conductor arrangement with a first flat conductor bar 2 and a second flat conductor bar 3 arranged in layers or sandwich-like as so-called multi-level conducting bars. For example, the flat conductor bars are made of an aluminum material and encased in an insulating sheath (not further specified), thereby being electrically isolated from one another. For the shielding, which improves the electromagnetic compatibility (EMC) of the cable arrangement 1, the flat conductor arrangement with the flat conductor bars 2, 3 comprises a flat conductor shield 4, of which only a section is shown here, schematically indicated for better clarity. In this embodiment the flat conductor shield 4 is designed as a shield foil surrounding or enveloping the flat conductor bars 2, 3. This means that the flat conductor shield 4 is embodied here in an exemplary manner as a so-called composite shield for both flat conductor bars 2, 3.

Figure 1:
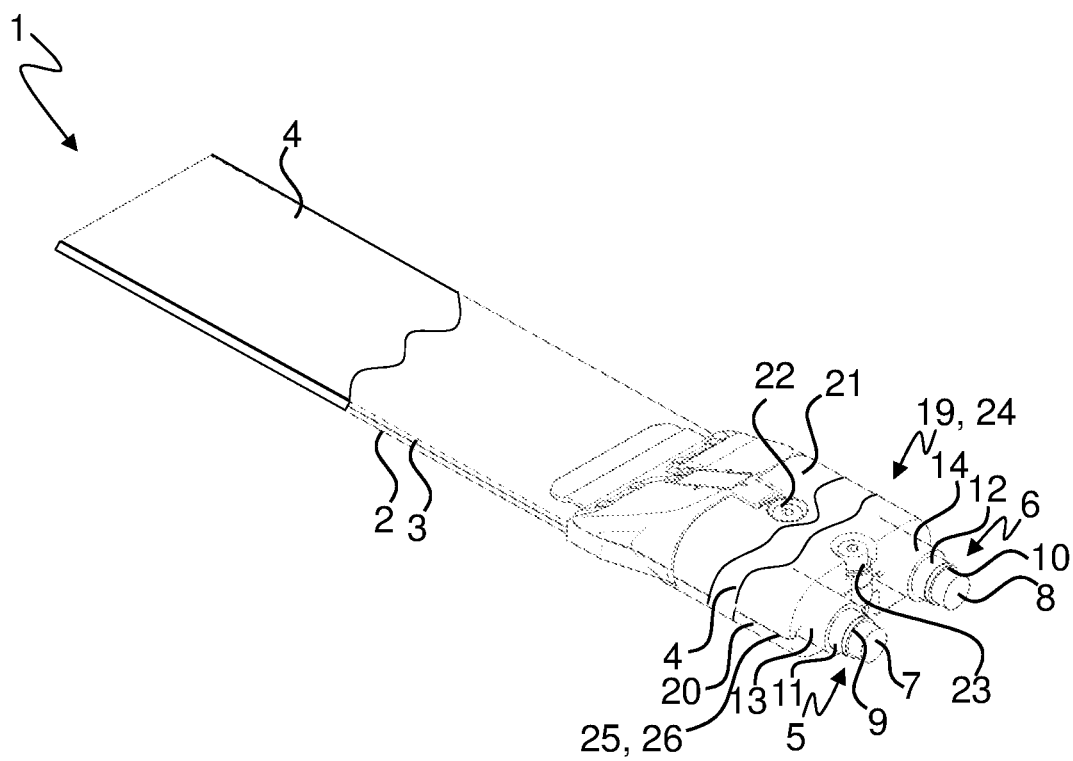
FIG. 1 shows a perspective view of an electric cable arrangement according to the invention.

The cable arrangement 1 also has as examples two shielded electric cables 5, 6, namely a first electric cable 5 and a second electric cable 6. Each cable 5, 6 has a load conductor 7, 8 made of a material such as aluminum or copper, a surrounding inner sheath 9, 10, a cable shield 11, 12 arranged thereupon and a surrounding outer sheath 13, 14. At a longitudinal end section (hidden here) each wire is stripped and the respective cable shield 11, 12 is turned against the running direction of the cable (i.e. in a direction facing away from a longitudinal end section of the flat conductor bar 2, 3), and rests on a respective support sleeve 15, 16 placed on the outer sheath 13, 14 (see FIG. 5, for example). The support sheath 15, 16 forms a sort of abutment for a particular crimp sleeve or ferrule 17, 18, which is crimped or press-fitted onto the cable 5, 6 (see FIG. 5, for example). The ferrule 17, 18 is electrically conductive and contacts the cable shield 11, 12 that is held underneath it. The cables 5, 6 and the flat conductor bars 2, 3 have the same longitudinal direction; i.e. they extend parallel to one another.

It can be seen in FIG. 1 that respective end sections of the particular flat conductor bars 2, 3 or the cables 5, 6 are brought together in a shield housing 19 of the cable arrangement. The shield housing 19 is produced in a die-casting process from an electrically conductive material, in the present case an aluminum material such as aluminum or an aluminum alloy, and it has a first housing part 20 as the housing base and a second housing part 21 as the housing cover. The two housing parts 20, 21 are screwed together through two screw connections 22, 23 (in this case) that are spaced apart in the longitudinal direction of the cables 5, 6. The respective end face sections of the flat conductor bars 2, 3 and of the cables 5, 6 are accommodated in the shield housing 19, and they are clamped tight for attachment between the housing parts 20, 21. For this purpose, the housing parts 20, 21 form a cable bushing (not shown in detail) that is composed of one housing-side indentation in each housing part 20, 21. The end sections of the flat conductor bars 2, 3 are surrounded by a plastic sheath (hidden here by the shield housing 19) serving as the clamping body with which the shield housing engages for the attachment by clamping. In the lengthwise direction of the flat conductor bars 2, 3 the plastic sheath is open for contacting the cables 5, 6. The cables 5, 6 are held on the shield housing 19 by clamping via the ferrules 17, 18. A connecting section (hidden here by the shield housing 19) is also situated inside the shield housing 19 between the flat conductor bar 2, 3 and the cable 5, 6; its end sections are welded together there, i.e. they are connected in a material fit. Thus, a shield transition via the shield housing 19 takes place between the flat conductor shield 4 and the respective cable shield 11, 12.

Figure 2:
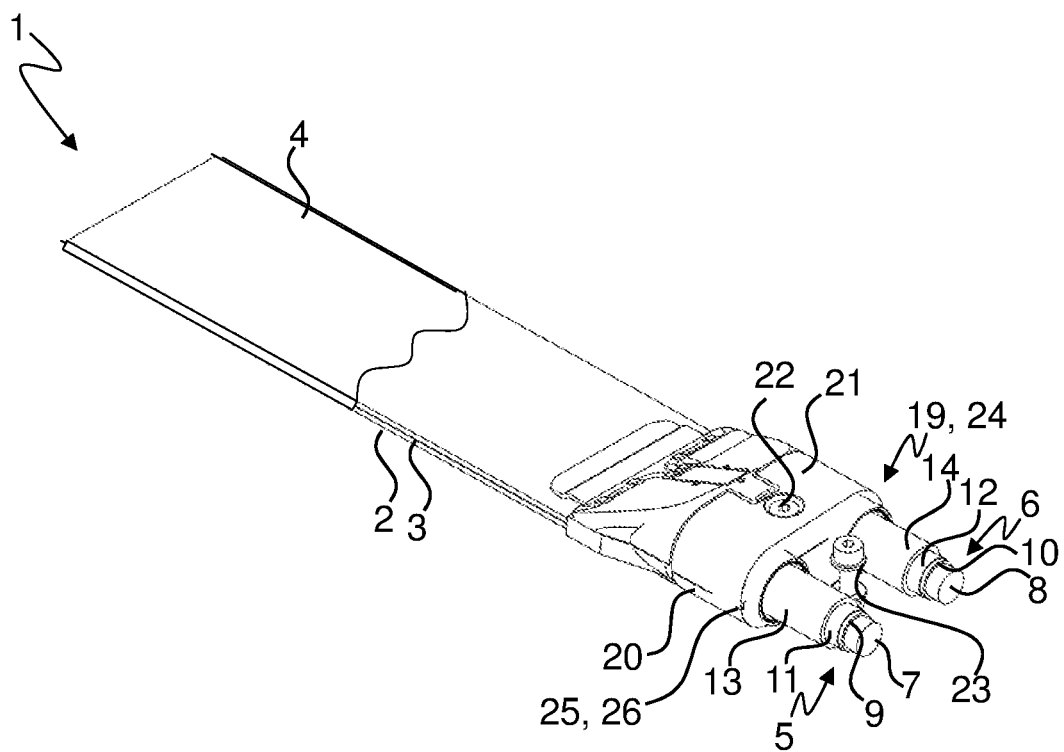
FIG. 2 shows a perspective partial view of a cable arrangement according to the invention.

FIG. 2 shows a perspective partial view of the cable arrangement 1. It is feasible that in the interior of the shield housing 19 a self-contained accommodating chamber 24, particularly one closed at the end faces, is provided, in which the relevant connecting section is accommodated between the flat conductor bar 2, 3 and the corresponding cable 5, 6 and is shielded inside the accommodating chamber 24. There is also a recognizable indication that a cover-side housing land 25 and a base-side housing land 26 overlap around the shield housing 19 by sections or continuously in such a manner that they overlap transversely to the longitudinal direction of the flat conductor bars 2, 3 or of the cables 5, 6, in order to thereby create especially good shielding to improve the EMC. To this end, the housing lands 25, 26 are formed on the respective abutting edges (not shown in detail) of the two housing parts 16, 17. The housing lands 25, 26 are recesses in the housing wall or projections from the housing wall which have laterally at least in the lengthwise direction and/or in the transverse direction a smaller wall thickness than the remaining housing wall, namely approximately half the wall thickness, for example. As a result, two overlapping housing lands 25, 25 approximately complement one another to make up the full wall thickness or they are essentially flush with the remaining housing wall.

Figure 3:
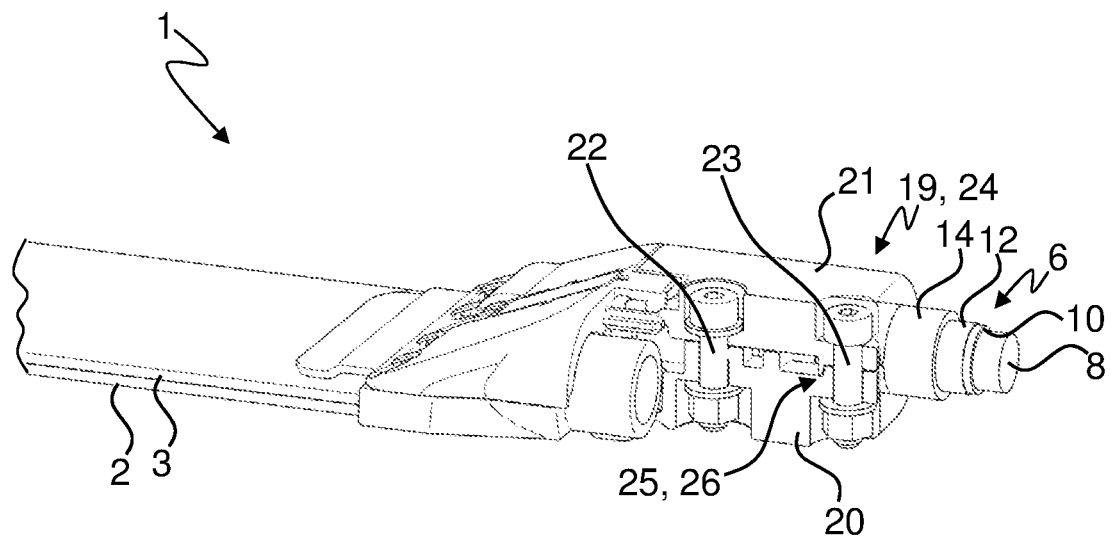
FIG. 3 shows a perspective side view of a partial section of the cable arrangement according to the invention.

The housing lands 25, 26 overlapping on the end face of the shield housing 19 are more easily recognized in FIG. 3, which shows a partial section in a perspective view of the cable arrangement 1. Accordingly, the housing lands 25, 26 overlap on the end face in the longitudinal direction. In addition, it can be recognized that the accommodating chamber 24 is also at least mostly closed between the two cables 5, 6. Thus, the interior of the accommodating chamber 24 is also closed off in the transverse direction.

Figure 4:
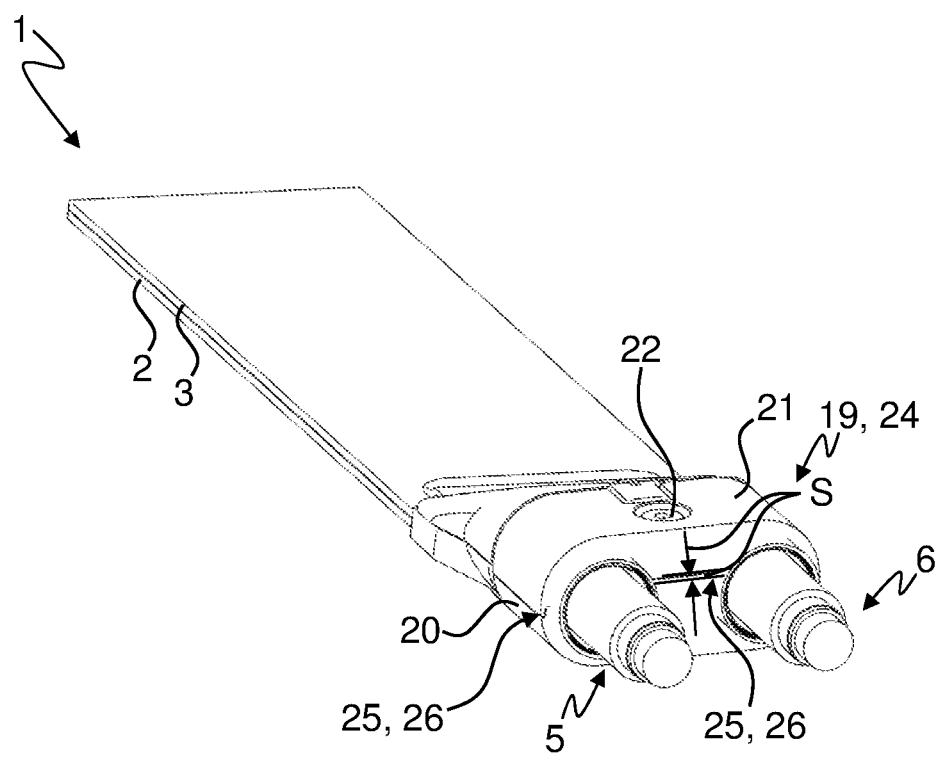
FIG. 4 shows a perspective front view of a partial section of the cable arrangement according to the invention.

FIG. 4 shows a perspective front view of the cable arrangement 1. It shows that before the screw connections 22, 23 are tightened, there is a gap S at the end face between the housing parts 20, 21. The housing parts can be clamped against each other through the gap S across their entire width by tightening the screw connections 22, 23, thereby balancing out the relaxation and creep inherent in the aluminum material. Depending on the size of the shield housing 19, the gap may be a few tenths of a millimeter in size. In the present case 2 mm are taken as an example. The screw connections 22, 23 are tightened securely enough that the gap in the installed state diminishes in size or disappears altogether.

Figure 5:
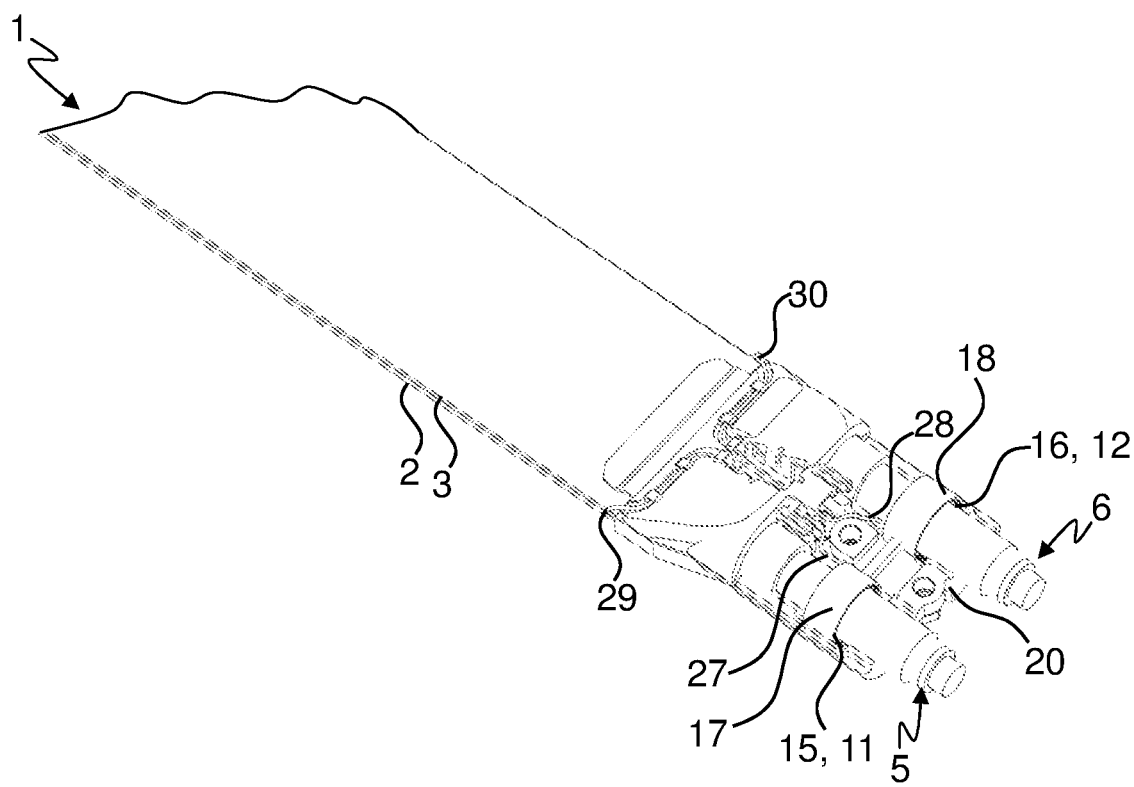
FIG. 5 shows a perspective plan view of another embodiment of the cable arrangement according to the invention.

In the perspective plan view of an additional embodiment of the cable arrangement 1 as shown in FIG. 5, which can be combined with the above, the second housing part 21 serving as the housing cover is hidden to reveal the interior of the accommodating chamber 24. This shows that a cable-side drain wire 27, 28 is clamped tight here between the particular ferrule 17, 18 and the particular cable shield 11, 12. It follows that the drain wire directly contacts the cable shield 11, 12, which is also clamped onto the ferrule 17, 18. The drain wire 27, 28 is guided through the interior of the shield housing 19 in the longitudinal direction. The drain wire 27, 28 fundamentally contacts the flat conductor shield 4, which is either designed as a shield foil, as described above, or, as shown in FIG. 5, it is designed alternatively or in addition as one or more drain wires 29, 30 on the flat cable side. The respective drain wires 27, 28, 29, 30 on the cable side and the flat conductor side are connected together inside the accommodating chamber 24 for the shield transition.

In addition, as seen in FIG. 5, hiding the second housing part 21 makes it possible to recognize the ferrule 17, 18 and the suggested support sleeve 15, 16 with the cable shield 11, 12 arranged in between.

Figure 6:
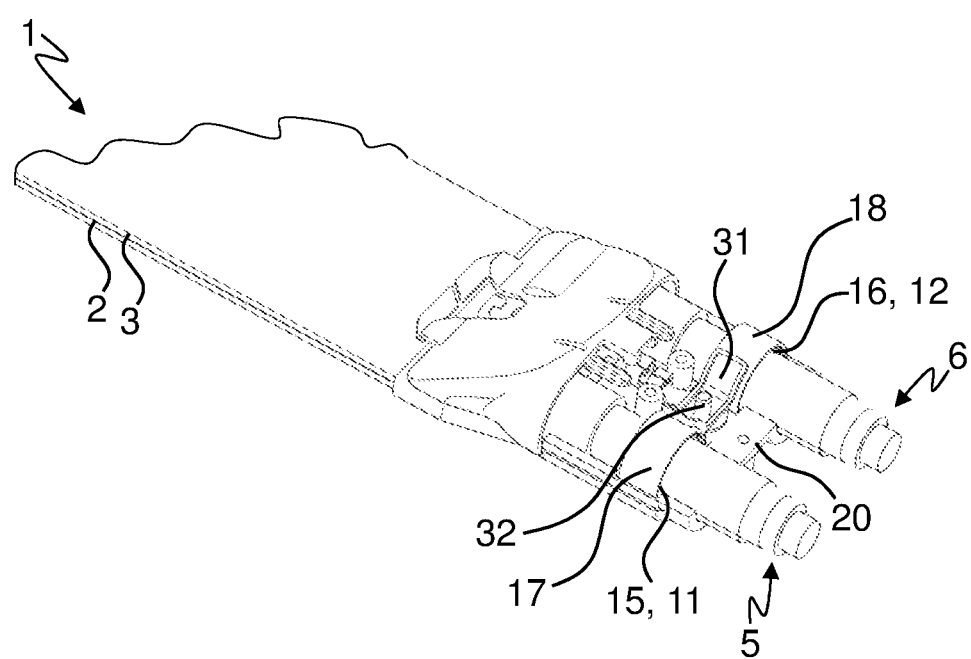
FIG. 6 shows a perspective plan view of an additional embodiment of the cable arrangement according to the invention.

FIG. 6 shows a perspective plan view of an additional embodiment of the cable arrangement 1 that can be combined with that described above. Here the respective ferrule 17, 18 is pressed to the housing part 20 serving as the housing base, and it is also held in place by a pressure element 31 provided here as a pressure bracket or spring bracket. Unlike the variants described above, in which the ferrule 17, 18 is clamped tight through the clamping force of the interacting housing parts 20, 21, the pressure element 31 here clamps the ferrule 17, 18 against the housing part 20. The shielding current or compensating current in this case may flow either directly via the housing part 20 or via the pressure element 31 and the housing part 20. The electrical conductivity of the pressure element 31 can be increased as needed, for example by using copper-plated (spring) sheet to produce the pressure element 31.

Moreover, FIG. 6 shows that the pressure element 31 is held on a threaded bolt 32 supported on the housing part 20 by a collar (hidden in FIG. 6 by the pressure element 31). The threaded bolt 32 here is designed as a press-fit bolt as an example; it is press-fitted into the housing part 20 accordingly. The pressure element 31 may be secured by a contact element and/or an attachment element (not shown), such as a terminal lug or the like.

Starting from the embodiments presented above, the cable arrangement and the shield housing 19 according to the invention can be modified in many different ways. For example, as suggested above, a combination of the flat conductor shield 4 embodied as the shield foil and the cable-side drain wires 27, 28 may be provided. In addition, the sections of the shield housing 19 on which the ferrules 17, 18 are clamped tight may be tin-plated or silver-plated by sections to improve the electrical conductivity.

LIST OF REFERENCE NUMBERS 1 electric cable arrangement
2 first flat conductor bar
3 second flat conductor bar
4 flat conductor shield
5 first electric cable
6 second electric cable
7 first load conductor
8 second load conductor
9 first inner sheath
10 second inner sheath
11 cable shield
12 cable shield
13 first outer sheath
14 second outer sheath
15 support sleeve
16 support sleeve
17 crimp sleeve/ferrule
18 crimp sleeve/ferrule
19 shield housing
20 first housing section (e.g., housing base)
21 second housing section (e.g., housing cover)
22 screw connection
23 screw connection
24 accommodating chamber
25 housing land
26 housing land
27 (cable-side) drain wire
28 (cable-side) drain wire
29 (flat conductor-side) drain wire
30 (flat conductor-side) drain wire
31 pressure element
32 threaded bolt
S gap

The invention claimed is:

1. An electric cable arrangement (1) comprising at least one dimensionally stable flat conductor bar (2, 3) with a flat conductor shield (4); at least one electric cable (5, 6) connected thereto and having a cable shield (11, 12); and a shield housing (19) of an aluminium material, with a first housing part (20) and a second housing part (21) forming a closed accommodating chamber (24) in between for a connecting section between the flat conductor bar (2, 3) and the cable (5, 6), and between which in the installed state the flat conductor bar (2, 3) and the cable (5, 6) are clamped by a respective end section in such a way that the flat conductor shield (4) and the cable shield (11, 12) are directly or indirectly connected together for the shield transition; and wherein the cable shield (11, 12) is held between a support sleeve (15, 16) and a ferrule (17, 18) press-fitted onto the cable (5, 6) and contacting the shield housing (19).

2. The cable arrangement (1) according to claim 1, characterized in that the housing parts (20, 21) overlap by a respective housing land (25, 26) at least in sections at their mutually facing abutting edges.

3. The cable arrangement (1) according to claim 1, characterized in that the ferrule (17, 18) is clamped tight between the first housing part (20) and the second housing part (21) in a cable bushing formed therein in the shape of an indentation.

4. The cable arrangement (1) according to claim 3, characterized in that the housing parts (20, 21) are shaped in such a manner that, prior to installation, a gap (S) of 0.1 mm to 0.5 mm, preferably 0.2 mm in size is formed between abutting edges of the housing parts in a housing section adjacent to the cable bushing.

5. The cable arrangement (1) according claim 1, characterized in that a preferably resilient pressure element (31) abutting an outer circumferential surface of the ferrule (17, 18) presses the ferrule (17, 18) against at least one housing part (20, 21).

6. The cable arrangement (1) according to claim 5, characterized in that the pressure element (31) is held in place on the housing part (20, 21) by a threaded bolt (32) supported on the housing part (20, 21) in the installed state by a collar.

7. The cable arrangement (1) according to claim 1, characterized in that at least one cable-side drain wire (27, 28) contacting the cable shield (11, 12) is held between the support sleeve (15, 16) and the ferrule (17, 18).

8. The cable arrangement (1) according to claim 7, characterized in that the drain wire (27, 28) is guided through the shield housing (19) on to the flat conductor shield (4), contacting the same in the installed state.

9. The cable arrangement (1) according to claim 1, characterized in that the flat conductor shield (4) comprises a bar-side drain wire (29, 30) that is guided along a longitudinal direction of the flat conductor bar (2, 3) and leads into the shield housing (19).

10. The cable arrangement (1) according to claim 1, characterized in that the flat conductor shield (4) comprises an electrically conductive shield foil surrounding the flat conductor bar (2, 3).

11. The cable arrangement (1) according to claim 10, characterized in that the shield foil contacts the shield housing (19) or surrounds the shield housing at least in sections.

12. The cable arrangement (1) according to claim 1, characterized in that the flat conductor bar (2, 3) comprises a plastic sheath arranged at the end face and clamped tight between the housing parts (20, 21).

13. The cable arrangement (1) according to claim 1, characterized in that a load conductor (7, 8) of the cable (5, 6) is welded to the flat conductor bar (2, 3).

14. The shield housing (19) for a cable arrangement (1) according to claim 1.

* * * * *